(12) United States Patent
Spring et al.

(10) Patent No.: US 7,091,080 B2
(45) Date of Patent: Aug. 15, 2006

(54) DEPLETION IMPLANT FOR POWER MOSFET

(75) Inventors: Kyle Spring, Temecula, CA (US);
Jianjun Cao, Temecula, CA (US);
Thomas Herman, Manhattan Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 144 days.

(21) Appl. No.: 10/083,060

(22) Filed: Feb. 26, 2002

(65) Prior Publication Data

US 2002/0117687 A1    Aug. 29, 2002

Related U.S. Application Data

(60) Provisional application No. 60/271,550, filed on Feb. 26, 2001.

(51) Int. Cl.
*H01L 21/336* (2006.01)
*H01L 21/331* (2006.01)
*H01L 21/8224* (2006.01)

(52) U.S. Cl. .................. 438/212; 438/270; 438/271

(58) Field of Classification Search ............. 257/329, 257/334, 335
See application file for complete search history.

(56) References Cited

U.S. PATENT DOCUMENTS 4,969,028 A * 11/1990 Baliga ................... 257/124
5,248,627 A * 9/1993 Williams ................ 437/45
5,424,231 A * 6/1995 Yang .................... 437/40
5,451,533 A * 9/1995 Williams et al. ........ 437/41
5,465,000 A * 11/1995 Williams ............... 257/335
5,477,077 A * 12/1995 Kumagai et al. ....... 257/487
5,529,940 A * 6/1996 Yamamoto et al. ..... 437/40
5,729,037 A * 3/1998 Hshieh et al. .......... 257/329
5,731,611 A * 3/1998 Hshieh et al. .......... 257/341
5,907,169 A * 5/1999 Hshieh et al. .......... 257/262
5,907,776 A * 5/1999 Hshieh et al. .......... 438/270
6,048,759 A * 4/2000 Hshieh et al. .......... 438/206
6,049,104 A * 4/2000 Hshieh et al. .......... 257/341
6,114,207 A * 9/2000 Okabe et al. .......... 438/270
6,391,723 B1 * 5/2002 Frisina .................. 438/268

* cited by examiner

*Primary Examiner*—Long Pham
*Assistant Examiner*—Shrininvas H Rao
(74) *Attorney, Agent, or Firm*—Ostrolenk, Faber, Gerb & Soffen, LLP

(57) ABSTRACT

A vertical MOSFET has a substrate of a first conductivity type. A channel region of a second conductivity type is diffused into the substrate. A gate is disposed at least partially over the channel region. A source region of a second conductivity type is disposed proximate to the gate and adjacent to the channel region. The channel region includes a depletion implant area proximate to the gate. The depletion implant species is of the second conductivity type to reduce the concentration of the first conductivity type in the channel region without increasing the conductivity in the drain/drift region.

8 Claims, 1 Drawing Sheet

DEPLETION IMPLANT FOR POWER MOSFET

RELATED APPLICATION

This application claims the benefit of U.S. Provisional Application No. 60/271,550, filed Feb. 26, 2001.

FIELD OF THE INVENTION

This invention relates to Power MOSFET devices and a process for their manufacture, and more specifically relates to a process and structure for preventing punch-through breakdown and reducing gate to drain charge ($Q_{GD}$) in low blocking voltage MOSFET devices.

BACKGROUND OF THE INVENTION

When a vertical conduction MOSFET is in a blocking mode, the inherent P/N body diode depletes toward the source. If there is insufficient charge in the channel (or body) region, punch-through occurs before avalanche breakdown is reached.

In a low voltage VDMOS device (Vertical Conduction Double Diffused MOS), this premature punch-through is normally prevented by using a higher channel dose and/or a deeper channel drive than might be otherwise required for a given avalanche breakdown value.

However, the higher channel dose results in a correspondingly higher threshold voltage $V_{TH}$; while a deeper channel drive increases channel length and thus channel resistance. The deeper channel drive also increases the depth of the JFET region between adjacent channel regions, thus reducing the optimum utilization of the epitaxial silicon receiving the diffusions.

A process and structure which prevents punch-though without increasing channel dose or channel depth would be very desirable before avalanche voltage is reached.

BRIEF DESCRIPTION OF THE INVENTION

In accordance with the invention, a depletion implant is formed in the top surface of the epitaxial silicon for a low voltage (under 40 volts avalanche) MOSFET prior to the formation of the body and source diffusions. Thus, a boron blanket implant will be used in an N channel VDMOS (to reduce the net N type concentration); and an Arsenic or Phosphorus implant is used in a P channel VDMOS. The depletion implant enables the use of a lower channel implant dose and/or a shorter channel drive without getting into a punch-through condition before avalanche voltage is reached. This novel technique will also lower channel resistance which, for low voltage MOSFETs, (for example, 40 volts or less) is a significant portion of the device total on-resistance.

The depletion implant can be applied at any time prior to the channel diffusion, for example; before the first field oxidation; before gate oxidation or after the polysilicon etch but before the channel implant. Note that if the depletion implant is applied after the polysilicon etch that a deep drive thereof is required before the channel drive.

The novel depletion implant of the invention will put a uniform charge into the channel region, therefore preventing punch through as described above.

DETAILED DESCRIPTION OF THE DRAWINGS

Figure 1:
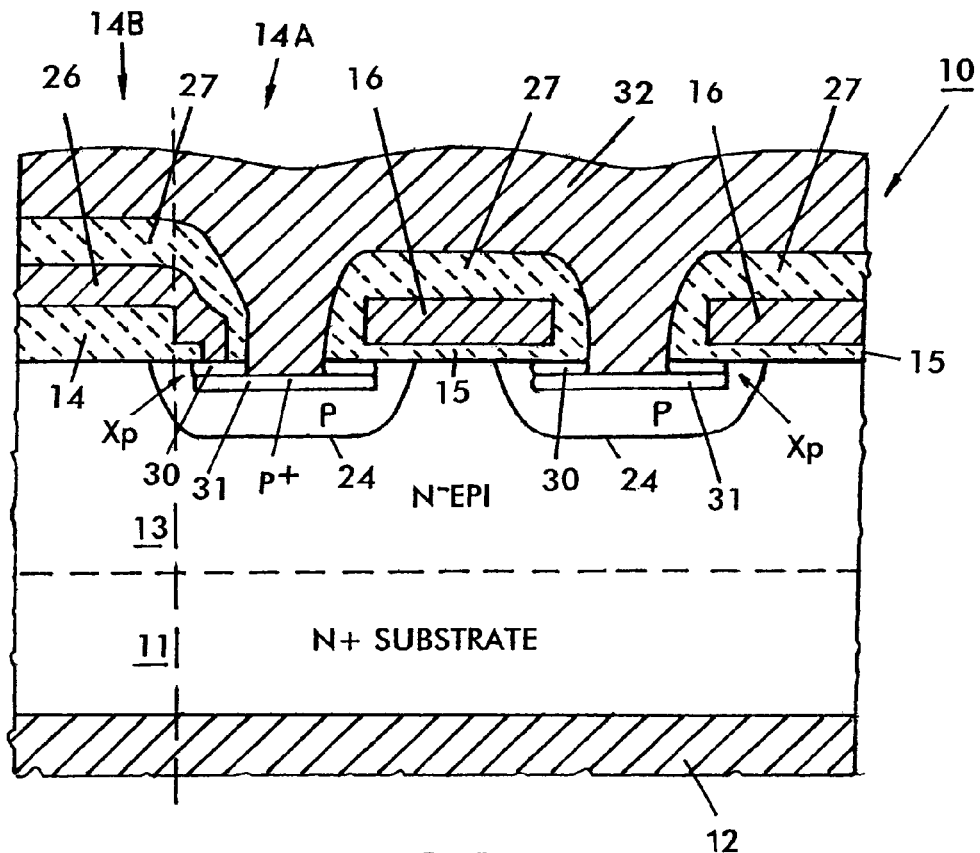
FIG. 1 is a cross-section of a small segment of an N channel DMOS die which receives the novel depletion implant of the invention.

FIG. 1 shows a small portion of an N channel VDMOS die 10 in cross-section. It should be noted that the invention also applies to P channel devices in which the concentration types are reversed from those shown in FIG. 1.

The device comprises an $N^+$ substrate 11 having a bottom drain electrode metal 12 on its bottom. An epitaxially grown $N^-$ layer ("epi") 13 is formed atop substrate 11 and is the junction-receiving layer of the device. The concentration $N_D$ of $N^-$ epi 13 is shown by the line 35 in FIG. 2.

In the well known process for making the device of FIG. 1, and delaying mention of the novel depletion implant of the invention, a field oxide is first formed on the upper surface of $N^-$ epi 13. The field oxide is then removed in the active area of the device, leaving only the segment 14 shown in the termination region. Thereafter, a gate oxide 15 is grown atop the active area of die 10 and a conductive polysilicon gate layer 16 is grown above oxide 15. The polysilicon 16 and oxide 15 are then patterned to any desired stripe or cellular topology, and windows are opened therein. P type channel (or base) regions 24 are then implanted and diffused as shown. Boron may be conventionally used for this process.

The implant dose and diffusion drive time will determine the conductivity and depth of the channel regions 24. At the same time that windows are opened in layer 16, a conductive polysilicon field plate 26 (an extension of layer 16) is also defined in the termination region.

A source implant and drive are performed to form the source region 30. Then, a heavy base boron implant is done to form region 31 ($P^+$). An oxide interlayer 27 is next deposited atop the wafer and is patterned to open windows to form contacts. The source regions are conventionally etched at their center to a given depth. An aluminum source contact 32 is then deposited atop the wafer and in contact with the $N^+$ type source regions 30 and the heavy base $P^+$ region 31.

In accordance with the invention, and prior to the field oxide step forming oxide 14 or prior to the gate oxide step forming gate oxide 15, a P type boron blanket implant of low concentration is applied over the top of the active surface of epi layer 13. This novel depletion implant will reduce the concentration in the channel region to help reduce the occurrence of punch-through, even though a low P concentration is used in the channel region (between channel and source perimeters) and will reduce the gate to drain charge of the final device. An N type depletion implant will be used for a P channel structure.

Figure 2:
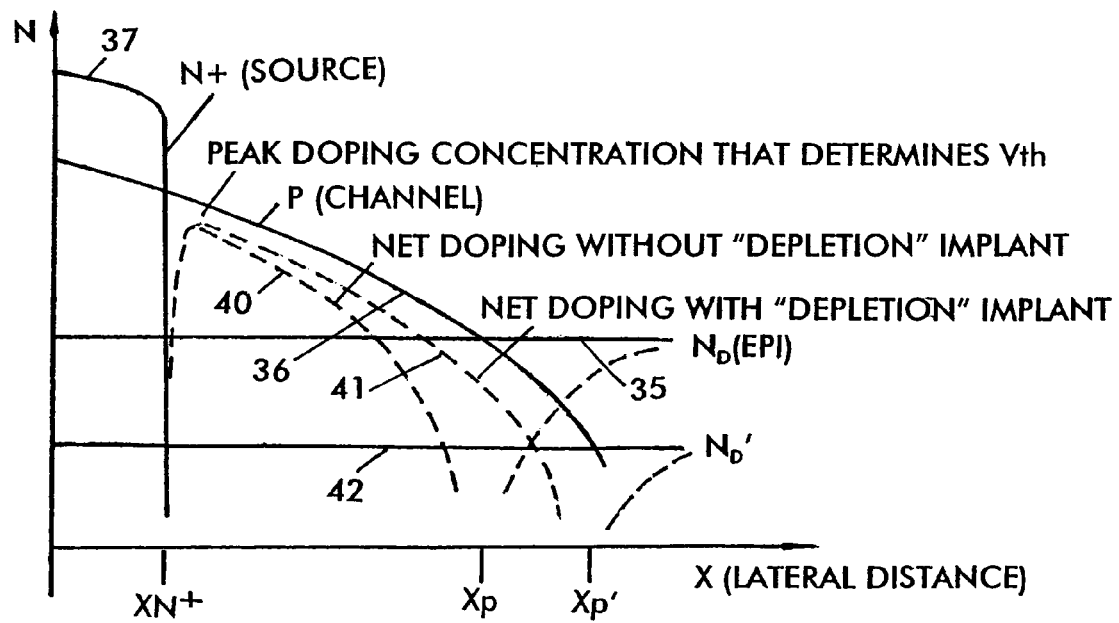
FIG. 2 shows the doping profile in FIG. 1 near the epi surface and illustrates the presence and effect of the novel depletion implant.

FIG. 2 shows the doping concentration N as a function of depth in the die of FIG. 1 from the silicon surface. Line 35 shows the concentration $N_D$ of eptiaxial layer 13. Line 36 shows the P concentration (unadjusted) of the P channel regions 24. Line 37 shows the concentration of the $N^+$ sources 30. Line 40 shows the net P channel doping (in the invertible channels), which is the net P channel doping in regions 24, minus the $N^-$ concentration 40.

The novel depletion implant, shown by line 42, of boron, (or some other P impurity) moves the net P concentration of the invertible channel 24 from line 40 to line 41, in accordance with the invention.

Clearly, if the invention is applied to a P channel device, an N depletion implant of arsenic or phosphorus is used.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A process for manufacturing a planar power semiconductor device comprising:
   providing a semiconductor die including an epitaxially grown silicon layer of a first conductivity formed over a substrate;
   designating an active area, said active area being a portion of said epitaxially grown silicon layer in which channel regions are formed;
   implanting dopants of a second conductivity in all of said active area of said epitaxially grown silicon layer;
   forming a plurality of spaced channel regions of said second conductivity in said active area of said epitaxially grown silicon layer, each channel region being spaced from another channel region by a first conductivity region in said epitaxially grown silicon layer;
   forming a source region of said first conductivity in each of said channel regions, each source region being less wide and less deep than a channel region in which it is formed; and
   forming a horizontally oriented gate structure over said epitaxially grown silicon layer and at least each channel region.

2. A process according to claim 1, further comprising forming a field oxide termination structure at the edge of said active area prior to said implanting step.

3. A process according to claim 1, further comprising forming a field oxide termination structure at the edge of said active area after said implanting step.

4. A process according to claim 1, wherein said gate structure comprises a gate oxide, said gate oxide being formed after said implanting step.

5. A process according to claim 2, wherein said field oxide is formed over said epitaxially grown silicon and etched to provide a window over said active area, wherein said dopants of said second conductivity are implanted through said window.

6. A process according to claim 1, wherein said dopants of said second conductivity are comprised of boron.

7. A process according to claim 1, wherein said dopants of said second conductivity type are comprised of either arsenic or phosphorous.

8. A process according to claim 1, further comprising, forming an oxide interlayer over said gate structure; opening windows in said oxide interlaver over at least said source regions; and forming a source contact over said oxide interlaver and a heavy base region.

* * * * *